United States Patent [19]
Holzmann

[11] Patent Number: 5,984,166
[45] Date of Patent: Nov. 16, 1999

[54] PROCESS FOR CREATING FINE AND COARSE PITCH SOLDER DEPOSITS ON PRINTED CIRUIT BOARDS

[75] Inventor: Andrew Vincent Holzmann, Coto De Caza, Calif.

[73] Assignee: Mask Technology, Inc., Santa Ana, Calif.

[21] Appl. No.: 08/897,211

[22] Filed: Jul. 9, 1997

[51] Int. Cl.$^6$ .......................... B23K 35/12; B23K 31/02
[52] U.S. Cl. ...................... 228/254; 228/248.1; 228/224; 118/504; 118/505
[58] Field of Search ................ 228/248.1, 224, 228/254; 427/96, 282; 118/504, 505, 213, 301, 406

[56] References Cited

U.S. PATENT DOCUMENTS

| | | | |
|---|---|---|---|
| 5,395,040 | 3/1995 | Holzmann | 228/254 |
| 5,460,316 | 10/1995 | Hefele | 228/39 |
| 5,492,226 | 2/1996 | Hoebener et al. | 228/248.1 |
| 5,681,387 | 10/1997 | Schmidt | 118/105 |
| 5,804,248 | 9/1998 | Hewett | 427/96 |
| 5,813,331 | 9/1998 | Tan et al. | 101/129 |
| 5,825,629 | 10/1998 | Hoebener et al. | 361/777 |

*Primary Examiner*—Patrick Ryan
*Assistant Examiner*—Carlos Gamino
*Attorney, Agent, or Firm*—Richard T. Holzmann

[57] ABSTRACT

A method by which low melting point solder for reflow connection of components is formed on select fine and coarse pitch contacts of a printed circuit board simultaneously. A template with openings to select fine pitch circuit board contacts is placed in contact with fine pitch contacts. The fine and coarse pitch contacts of the board are exposed through holes in a stencil characterized in its ability to withstand solder reflow temperatures, not be wettable by solder, and have a coefficient of thermal expansion relatively matching the printed circuit board. Low temperature solder paste is screen deposited into the stencil openings. The stencil is removed and a mesh is fixedly positioned on the board, the solder paste retained by the stencil pattern is reflowed to selectively form on the underlying contacts of the printed circuit board. Thereafter, according to a preferred practice of the invention, the mesh is removed from the board and the board is subjected to previously practiced depositions of flux and paste in preparation for fine and coarse pitch component placement and ensuing solder reflow. Alternate practices of the invention involve concurrent deposition of fine pitch solder through a template and coarse pitch solder in the conventional manner in the absence of mesh with removal of the stencil prior to solder reflow.

23 Claims, 4 Drawing Sheets

Process Flow Chart  FIG. 7
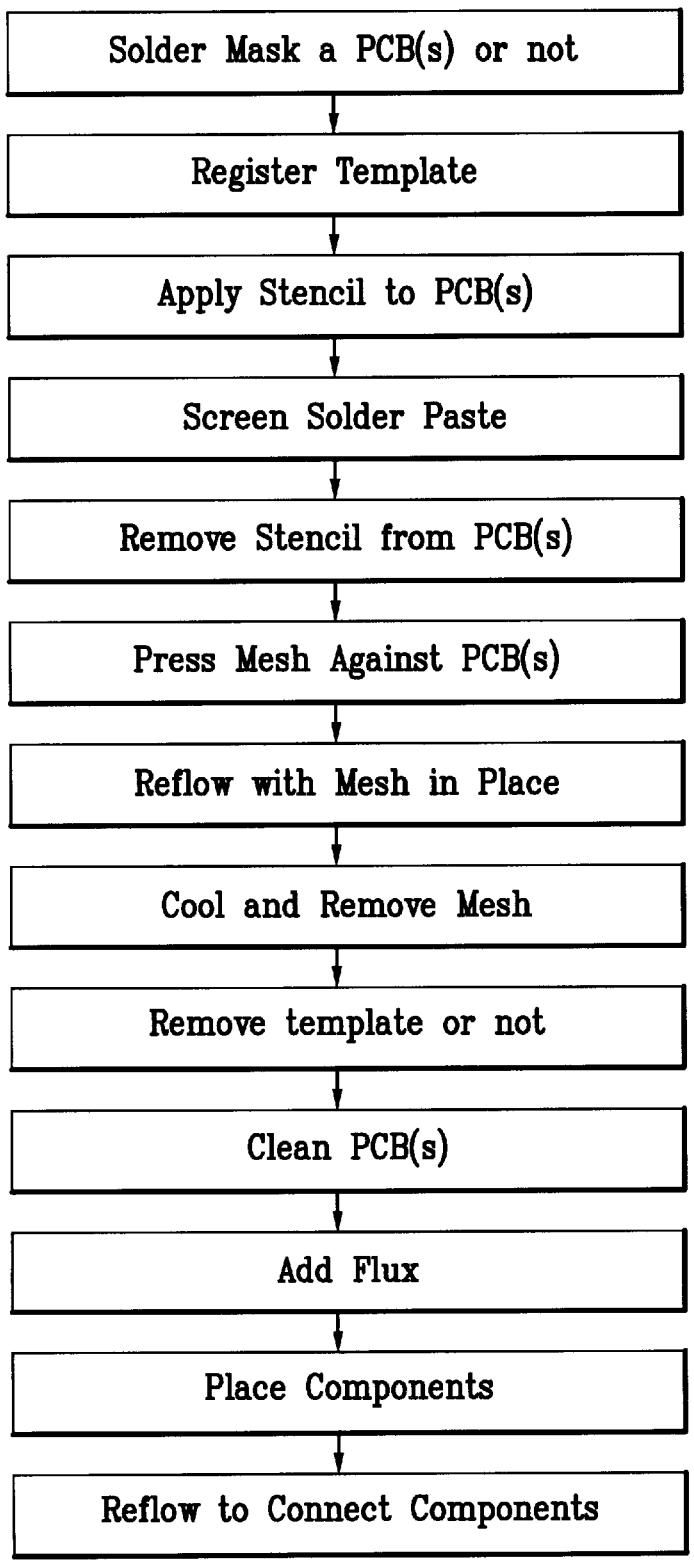

PROCESS FOR CREATING FINE AND COARSE PITCH SOLDER DEPOSITS ON PRINTED CIRUIT BOARDS

FIELD OF THE INVENTION

The present invention is related in general to printed circuit boards, and more particularly, to fine pitch solder deposits thereon.

BACKGROUND OF THE INVENTION

Advances in technology in the electronics industry continually drive manufacturers to reduce the size of finished products while, at the same time, increasing their power. This is certainly true with respect to notebook and palmtop computers as well as with cellular telephones and camcorders. Desk top computers today are as powerful as those which occupied an entire room years ago. Telephones now fit in a shirt pocket.

Nevertheless, there are sectors of the industry, for example, in the printed circuit board fabrication business and the assembly shops that attach components, such as packaged integrated circuit devices to the board, which have reached their limits using conventional approaches. The two major obstacles being the application of solder mask between surface mount pads and the printing of solder paste on those pads.

Typically, a printed circuit board having thereon both fine and coarse pitch copper contact patterns is coated with a permanent solder mask whose purpose is to allow soldering only to the exposed copper patterns. In many cases, it is desirable to image a solder mask dam or web at sites between surface mount lands to act as an isolating barrier during subsequent solder paste printing and reflow. This dam or web prevents shorts from forming. The solder mask must be thick enough to provide a dam into which an adequate volume of solder paste can be deposited by screen printing for subsequent reflow.

On coarse pitch products, about 0.016" (16 mil) or higher, this does not present a problem as the application and imaging of the solder mask is relatively easy. There is a sufficient gap between lands on the board to enable resolution of this web. When the pitch becomes finer, it becomes increasingly difficult to align (register) and develop these features. In many cases this obstacle is insurmountable using conventional technology and different approaches need to be used.

The basic processes involved in attaching surface mount components to a printed circuit board consists of the following: 1. Paste Printing; 2. Component Placement; and 3. Solder Reflow. The largest number of defects associated with this process, approximately 70%, are directy attributable to the printing of solder paste. For this as well as other reasons, several processes have recently been developed which apply a sufficient amount of solder to the board prior to the assembly stage which significantly simplifies the process and reduces the associated defects. However, processes such as Precision Pad Technology (PPT®), Optipad®, and Sipad® all require a solder mask dam or web between the lands for fine pitch applications in order to isolate the features and contain the solder.

Surface mount technology (SMT) is now routinely used to attach packaged integrated circuit devices to printed circuit boards. In one form, the practice involves the use of solder paste selectively deposited onto copper contacts of the printed circuit board through a stencil patterned with openings corresponding to the board contact locations. The solder paste is screen deposited in patterns on the printed circuit boards using the stencil as a mask and a doctor blade to squeegee the solder paste through the holes in the stencil. When the stencil is removed, the solder paste remains on the printed circuit board contacts.

Since the solder paste is typically 50% flux by volume, with the other 50% being particles of solder, the paste is also used to hold the component terminals in place during the solder reflow step which follows. The eutectic low melting point solder (63% tin, 37% lead-63/37) normally used permits reflow and concurrent bonding of the component terminals to the printed circuit board contacts at a temperature below 250 deg. C. compatible with the glass transition capabilities of flame retardent level 4 (FR4) printed circuit board materials.

The spacing of the leads for packaged integrated circuit components typically exhibit a pitch no finer than 16 mils. This capability is consistent with conventional SMT processes using screen deposited solder paste to hold and connect packaged integrated circuit devices to printed circuit boards.

Photolithographic processes used to form conductive contact patterns on modern printed circuit boards have the capability to create correspondingly fine pitch patterns. Unfortunately, attempts to screen solder paste in the fine pitch patterns characterizing the more advanced packaged integrated circuit devices in the neighborhood of 10 mil pitch have been frustrated by solder mask/solder paste problems.

In the absence of an effective solder paste screening process for depositing solder onto fine pitch printed circuit board contacts, other techniques have been employed. One approach uses masking and electroplating to deposit the solder. This process includes the formation of a photolithographically defined mask, an electroplate bath deposition of low melting solder on printed circuit board contacts not covered by the mask, a removal of the mask, and a reflow of the electroplated solder. The process involves numerous steps and has associated high cost.

Another approach involves the injection of molten solder through a dispensing head with a mask corresponding to the copper contact pattern of the printed circuit board. Unfortunately, the molten solder dispensing head is very expensive, requires a distinct mask for each different device footprint, and dispenses the solder to the contacts of only one die location at a time. An additional approach which reportedly has been used involves coating the entire board with molten solder thereby filling the wells and then blowing off the solder remaining on the solder mask. Of course, subjecting an entire board to the temperature and aggressiveness of molten solder is not an optimum solution to these problems.

The PPT® process has resulted in several U.S. patents being granted to Holzmann with the following U.S. Pat. Nos. 5,310,574; 5,395,040; and 5,403,671; as well as European Patent No. EP 0 640 271 B1 which contains essentially all significant features of the three prior U.S. patents. These patents teach the use of a mesh pressed against the circuit board with subsequent reflow whereby the mesh insures filling the well and shaping the formed solder with an imprint of the mesh on its top. Furthermore, the mesh forces excess solder, including solder balls, onto the upper surface thereof, thereby eliminating the possibility of short circuits caused by the excess solder . . . all the wells are filled. This excess is easily removed from the mesh. The other two processes, i. e., Optipad® and Sipad®, flatten the top surface of the solder deposit. All three of these processes suffer from the need for a solder mask for fine pitch applications, which mask has severe resolution problems when defining a fine pitch well for deposition of solder.

Other relevant prior art can be found in U.S. Pat. No. 5,492,266 granted to Hoebener wherein is disclosed a method and product for fine pitch solder deposits using a stencil to screen the solder paste leaving the stencil on the board on top of the solder mask during a reflow step. This method is suited to the fabrication of populated printed circuit boards having fine pitch devices including flip-chip devices, connected on a board including conventional coarse pitch surface mount components.

As Hoebener points out in his patent, however, there are several weaknesses in this method. For example, it is stated that, "Tests to date have confirmed that the shape of the hole has an effect on the volume and formation consistency of the low melting point solder deposited onto contact 2. However, the optimum shape has yet to be defined, and is likely to be related to the material used for the stencil, the thickness of the stencil, the size of the contact, and the composition and rheology of the solder paste." (emphasis added)

Furthermore, "The use of a common stencil for both the fine and coarse pitch contacts may result in less than normal solder volume for the coarse pitch contacts. However, it is anticipated that any such variations or problems can be overcome through process optimization."

In addition, "The solder formed on the coarse pitch contacts may not have to be flattened in preparation for component placement." This flattening requirement itself can be a substantial problem since it involves additional equipment and time, and runs the risk of producing a squeeze-out of excess solder, which solder can produce short circuits, and the need to clean this excess off.

Another alternative, " . . . involves the practice of the invention in which the stencil is not removed following reflow of the solder paste. This practice will likely involve the screening of paste for both fine and coarse pitch contacts using the common stencil, and the use of the flux to hold the components during final reflow step 36 . . . " One final point is that in the Hoebener method, solder mask is a requirement.

One recent relevant disclosure appeared in *Electronic Packaging & Production*, May '97, in an article entitled, "Forming BGAs with Solder Paste", Brutovsky, et al, of IBM, pp.57–61, wherein a top and bottom stencil are employed. The authors point out that existing paste stenciling operations produce highly repeatable solder volumes at high throughput rates. Also, solder purchased in paste form is much less expensive than that purchased as discrete balls of tightly controlled size conventionally used in BGA (ball grid assembly). Paste volume is a function of stencil thickness and aperture size. Stencil thickness is the key variable for controlling paste volume and resulting BGA ball size.

To avoid the problem of solder paste sticking to the aperture walls and pulling away from the laminate, these inventors use two different stencils. Their top stencil being fixed in an SMT screen printer is removed after screening, whereas their bottom stencil, made of magnetic steel with chrome plating, stays with the laminate through the solder paste reflow operation and is only removed thereafter. A special workholding fixture having magnets embedded therein holds the bottom stencil firmly in place against the PCB laminate.

Due to the size of this "sandwich", early designs were too massive to be heated adequately in existing reflow ovens; therefore, to reduce thermal mass, a window-frame-like design with special cutouts was used. The stenciling and reflow operation provide a consistent volume of solder to each BGA pad.

Since this method of depositing solder results in consistent solder volumes, it is less desirable when shaping solder deposits simultaneously on fine and coarse pitch contacts which require the deposit of variable solder volumes. Where varying volumes are necessary, the instant invention solves this problem as well, without the use of reflow ovens, and without the need for complex magnetic fixtures and stencils which appear to be suitable only for very high volume production.

In the context of this known technology, there remains the need for a process, and product formed thereby, which will deposit and shape solder on a fine pitch printed circuit board contact pattern within the framework of conventional screened solder paste deposition processes while providing solder volumes on both coarse and fine pitch contacts simultaneously adequate to connect conventional surface mount devices and other packaged integrated circuit device components in the presence or absence of a solder mask.

SUMMARY OF THE INVENTION

According to the teaching of the present invention, a method of forming fine and coarse pitch solder deposits simultaneously on a circuit board comprising the steps of: providing a solder mask having openings therein precisely aligned to coarse pitch contacts and defining only gross fine pitch contact areas of the circuit board, registering a template having matching defined open fine pitch contact pattern areas thereon with defined contact pattern areas on the circuit board, positioning a stencil having openings aligned to fine and coarse pitch contacts over the entire circuit board in intimate contact with the uppermost surface thereof, screen depositing solder paste into openings of the positioned stencil, removing the stencil from the circuit board, positioning mesh in intimate compressed contact with the entire circuit board, reflowing the solder paste with the positioned mesh in place to form solder on the circuit board contacts to connect components thereto, removing the mesh having excess solder on an upper surface thereof after the solder on the circuit board has been cooled and formed, and removing the template.

In variations of the basic practice, a plurality of templates may be used and these may be of differing heights to capture varying volumes of solder. These so-called circuit boards may be a conventional printed circuit board or a hybrid circuit board or even a semiconductor wafer. Furthermore, a plurality of circuit boards on an individual panel may be employed. The method is relatively independent of whether the solder is in the form of paste, cream, powder or solid solder; and whether it is deposited by screen printing, paste stencilling, electroplating, immersion in a molten solder bath or the like.

According to one practice of the invention, a solder mask is not required, for example, in working with tape automated bonding techniques; in another, the template remains on the board after the mesh is removed.

In yet another practice of the invention, a method of forming simultaneously fine and coarse pitch solder deposits on a circuit board comprising the steps of registering a template with openings aligned to select circuit board fine pitch contacts, positioning a stencil over the circuit board with openings aligned to select circuit board fine and coarse pitch contacts, screen depositing solder paste into openings of the positioned stencil, reflowing the solder paste while holding the positioned stencil against the circuit board to form solder on the select circuit board contacts, and releasing the stencil without removing the solder on the select circuit board contacts.

Also disclosed is a solder deposit comprising solder deposited on fine pitch contacts of a circuit board, heating means for softening said solder, and mesh means, in compressive contact with said heated solder, for forming and containing said solder within the x, y, and z directions of the fine pitch contacts while the top surface thereof is impressed with a mesh configuration.

BRIEF DESCRIPTION OF THE DRAWINGS

The above and other objects, features and other advantages of the present invention will be more clearly understood from the following detailed description taken in conjunction with the accompanying drawings, in which:

FIG. 7 is a process flow chart.

DETAILED DESCRIPTION OF THE PREFERRED EMBODIMENTS

Figure 1:
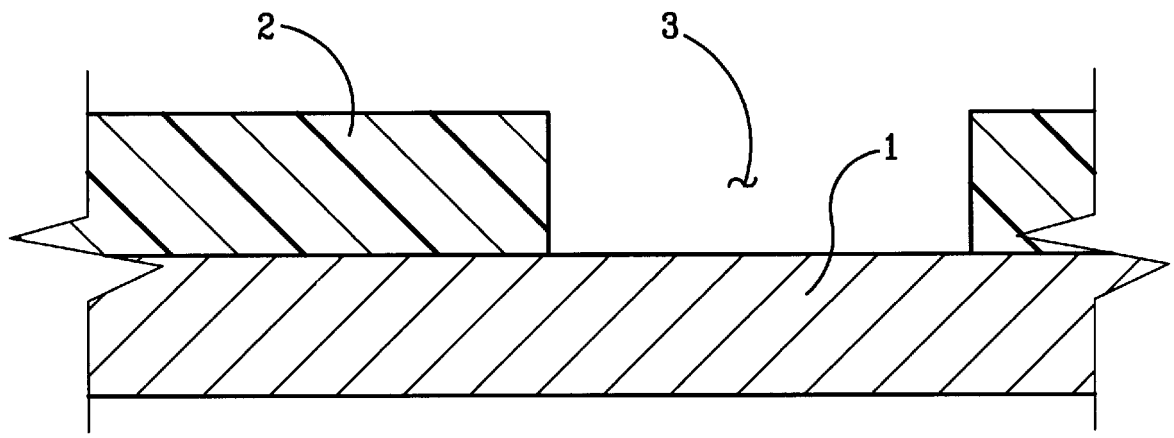
FIG. 1 is a side view of a printed circuit board illustrating the block opening in the solder mask.

The focus of the invention is on the deposition of low melting point solder in controlled and shaped volumes on fine pitch printed circuit board contacts as well as on circuit boards having both fine and coarse pitch patterns thereon, while maximizing the use of existing equipment and minimizing process steps and complexity.

The instant invention uses a template in place of a solder mask in the areas on the circuit board where the pitch is too dense to allow reliable application of solder mask. Rather than attempting to resolve the extremely small features with a solder mask, an opening is provided in the mask in the entire area where the fine pitch component(s) is to be placed. A template(s) with apertures for the surface mount lands is then placed in the openings left in the mask. With the template(s) in position, solder paste is then printed onto the surface mount pads as is done in a conventional process. Once the paste is printed, the template(s) could then either be removed or remain in place depending on the specific application. In most instances it is preferable to leave the template(s) in place until after the solder is reflowed and formed; it may also be desirable in certain instances to leave the template(s) permanently attached to the board.

The template can be made from various materials including stainless steel, plastic or film depending on the desired results and the cost. In other circumstances, coating the device with a Teflon®-like substance will prevent the solder paste from adhering thereto. Where there are usually only a few sites per board requiring templates, a chemically milled or laser etched stainless template can be advantageous. Should the panel require numerous templates, a suitable film treated on one side with adhesive is a preferred technique.

The use of a template instead of a solder mask offers a number of advantages over existing technology. The inherent limitations associated with resolution of fine pitch features are immediately overcome permitting board manufacturers to readily satisfy the latest requirements. Another immediate benefit associated with artwork registration is due to the fact that board manufacturers frequently build printed circuit panels containing numerous printed circuit board cards which are subsequently routed into individual ones. The major shortcoming using solder mask is that instead of registering the film to one or two fine pitch sites on the panel, one must now register to many . . . a difficult operation. Even were the boards and their artwork perfectly matched, film growth and distortions associated with temperature and humidity fluctuations oftentimes prevents the film from precise alignment. It is quite common for a technician to find that half the sites are aligned and the other half are not. In such case it is common practice to cut the film and align the individual pieces to the panel as necessary. The instant invention allows the technician to simply align the solder mask over the entire panel by placing the template in position exposing the open area fine pitch sites as the primary alignment feature. The same solder mask artwork produced by the CAD system is used to produce the template thereby assuring a perfect match.

The present invention avoids the complex plating operations and equipment requirements associated with the prior art deposition of low melting point solder in fine pitch patterns on a printed circuit board. FIGS. 1–4 summarize the key operations in one embodiment of the present invention.

In this practice of the invention, as is done in the prior art, solder mask 2 is applied to a printed circuit board (PCB) 1 having thereon both coarse and fine pitch patterns. The solder mask is then exposed with artwork that has the coarse pitch areas precisely defined and the fine pitch areas only grossly defined leaving an open block section 3. Upon developing the solder mask film 2 along with thermal and ultraviolet treatment thereof, the precisely defined coarse pitch copper lands (not shown) as well as the fine pitch open areas (not shown) are available for solder paste application thereon.

In the open area 3 is placed a template 4 having openings 5 which match the fine pitch fine copper patterns which template 4 was produced from the same artwork used to prepare the copper contacts and to prepare the stencil 6 which is next placed in intimate contact with the solder mask 2 and the template 4. With stencil 6 aligned to and fixed in location on the upper surface of printed circuit board 1, low melting point solder paste is squeezed into holes of stencil 6 using a doctor blade or other solder paste screening equipment which can obviously be used.

Stencil 6 is then removed and with template 4 still in place, is subjected to reflow temperature. After reflow and cooling, the board 1 is subjected to the conventional final steps in the process as shown in FIG. 7. Whether the template 4 remains permanently on board 1 or is removed depends upon the nature of the component to be subsequently placed and affixed to the board 1. Some components prefer a low volume of solder with the rounded meniscus ("bump") of the solder for attachment purposes; others prefer a higher volume of solder with a flattened upper surface; still others require a combination which may require flattening by one or another of prior art techniques. This invention was made to allow its use for a variety of component types as well as for a variety of coarse pitch and fine pitch copper contact areas on a single board or panel of boards. Of course, to maximize utilization of this process a careful selection of materials of construction of the template must be made to conform with the total process requirements. Certainly, non-wettability by solder is a necessary attribute of the template material as is coefficient of thermal expansion and thermal stability as is the case where the template is fabricated from plastic material which may or may not have properties permitting adherance to the board either temporarily or permanently.

The preferred practice of the invention utilizes mesh 7, as in the PPT® process, as the element which forms the solder with an imprint of the mesh on the top surface thereof, as well as disposing of any excess solder without the need for flattening and in addition avoiding the need for a reflow oven. In conventional practices, excess solder is usually present requiring its removal to avoid the problem of short circuits. The PPT® process solves this problem as well as the others presented above.

FIG. 1 illustrates the first step, the formation of a block opening 3 in solder mask 2 over the fine pitch copper contacts (not shown) on one surface of patterned printed circuit board 1. The fine pitch copper contact is a copper trace on the board, a layer of copper selectively patterned by conventional photolithographic processes. A conventional solder mask 2 is formed by a photolithographic process to cover all but the copper contacts and immediately adjacent printed circuit board surfaces. It should be noted that a plurality of fine pitch contacts may have been formed on a single board or panel of boards, or even coarse pitch contacts as well.

Figure 2:
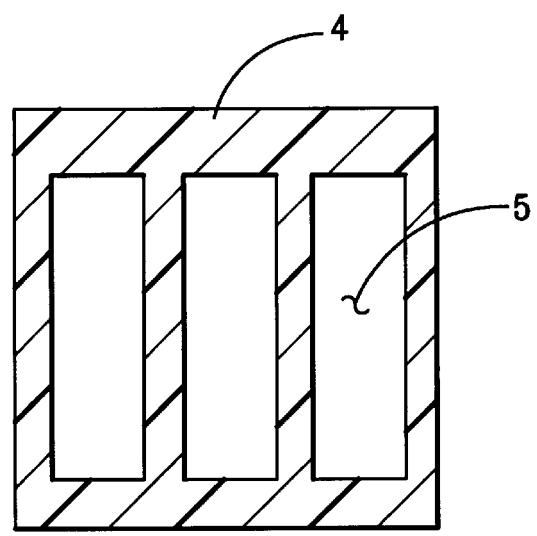
FIG. 2 is a top view of a template having openings corresponding to fine pitch copper contacts therein.

FIG. 2 shows a generalized top view of a template 4 with openings 5 therein conforming to the precise fine pitch copper patterns on the printed circuit board. The material of construction of the template depends upon the particular system requirements but must be non-wettable by solder and be able to withstand subsequent solder reflow temperature. It can be selected, for example, from those materials mentioned above.

Figure 3:
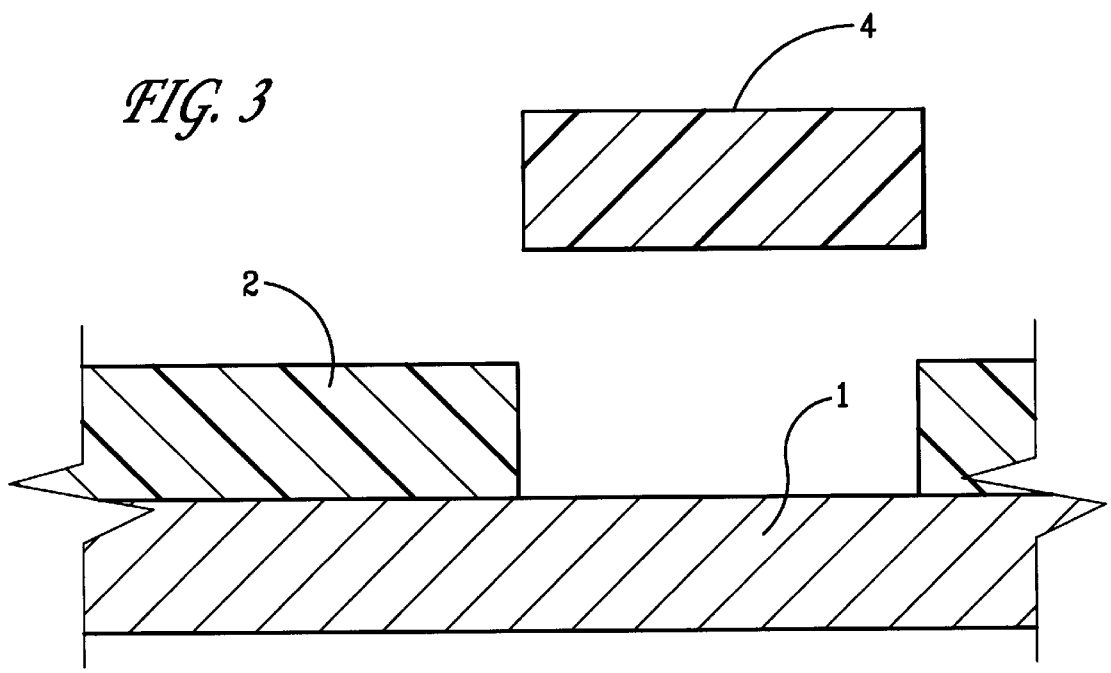
FIG. 3 is a side view of a template in place above the opening in the solder mask.
Figure 4:
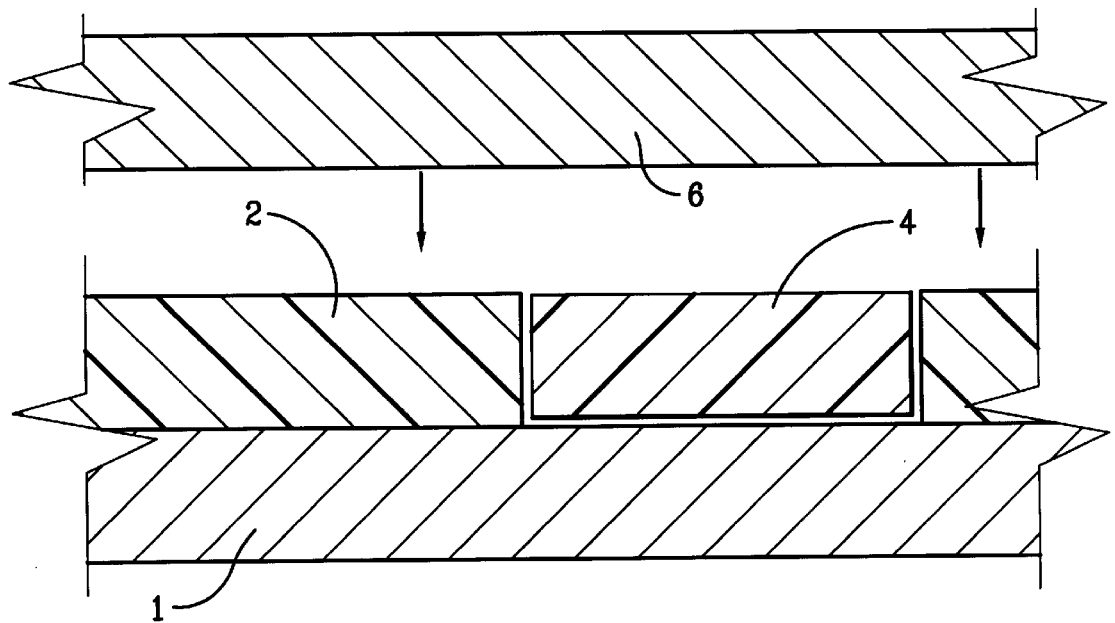
FIG. 4 is a side view of a template in place on a circuit board with a stencil located above.

FIG. 3 illustrates the next step, the placement of template 4 in position above solder mask open area 3 aligned to conform to fine pitch copper contact pattern on the printed circuit board. FIG. 4 shows template 4 in place on circuit board 1 with a photoimaged stencil 6 capable of contouring to match the surface of printed circuit board 1 as the board tolerances provide. Stencil 6 may be affixed to printed circuit board 1 in a variety of conventional manners: visually aligned and mechanically held, or vacuum held or the weight of the stencil itself (or with additional weights) may create sufficient contact to the printed circuit board itself. With stencil 6 aligned to and fixed in location on the surface of printed circuit board 1, low melting point solder paste is squeezed into the holes (not shown) of stencil 6 using conventional screen printing equipment such as those employing doctor blades.

With the solder paste confined within the walls of the template, thereby acting in effect as the dam or web of conventional imaged solder mask for coarse pitch copper contacts, but which conventional mask cannot precisely contain solder paste for fine pitch contacts, the stencil 6 is removed and the printed circuit board 1 with template 4 in place is transferred to a reflow oven where the solder melts and conforms to the walls of the holes of the template. Upon removal from the reflow oven the template can either be removed from the circuit board or it can be permanently left in place depending upon the requirements of component connection. Some applications can use a solder deposit with the solder "bump" shape on its top surface, other applications may require flattening by any of several available processes. Such a flattening operation uses a flattening mechanical tool, for example, a press with a flat plate, prior to component attachment. The flat surface of the solder reduces the likelihood of lateral movement in the component interacting with the curved surface of the solder deposit.

Figure 5:
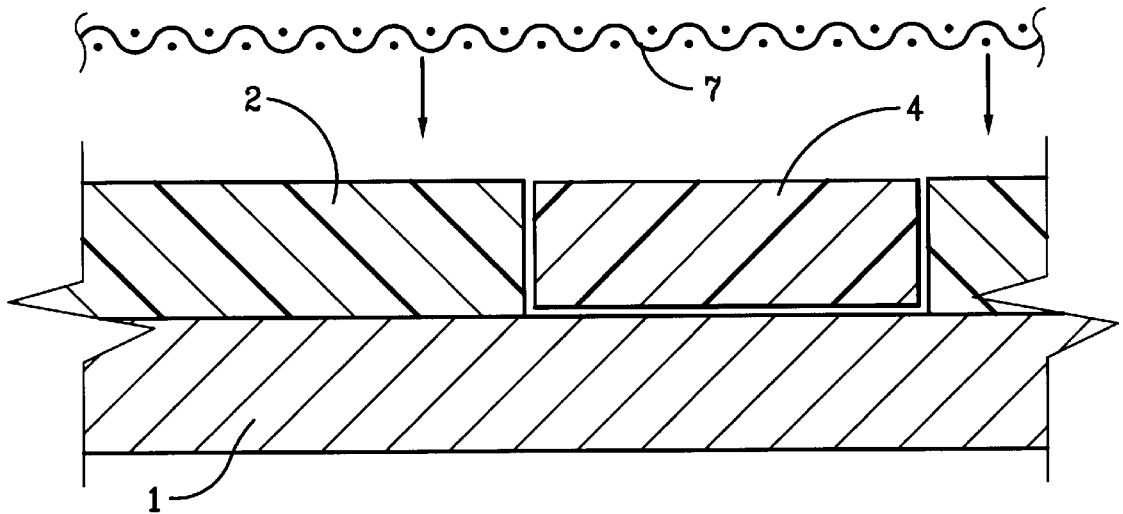
FIG. 5 shows a mesh substituted for the stencil of FIG. 4.
Figure 6:
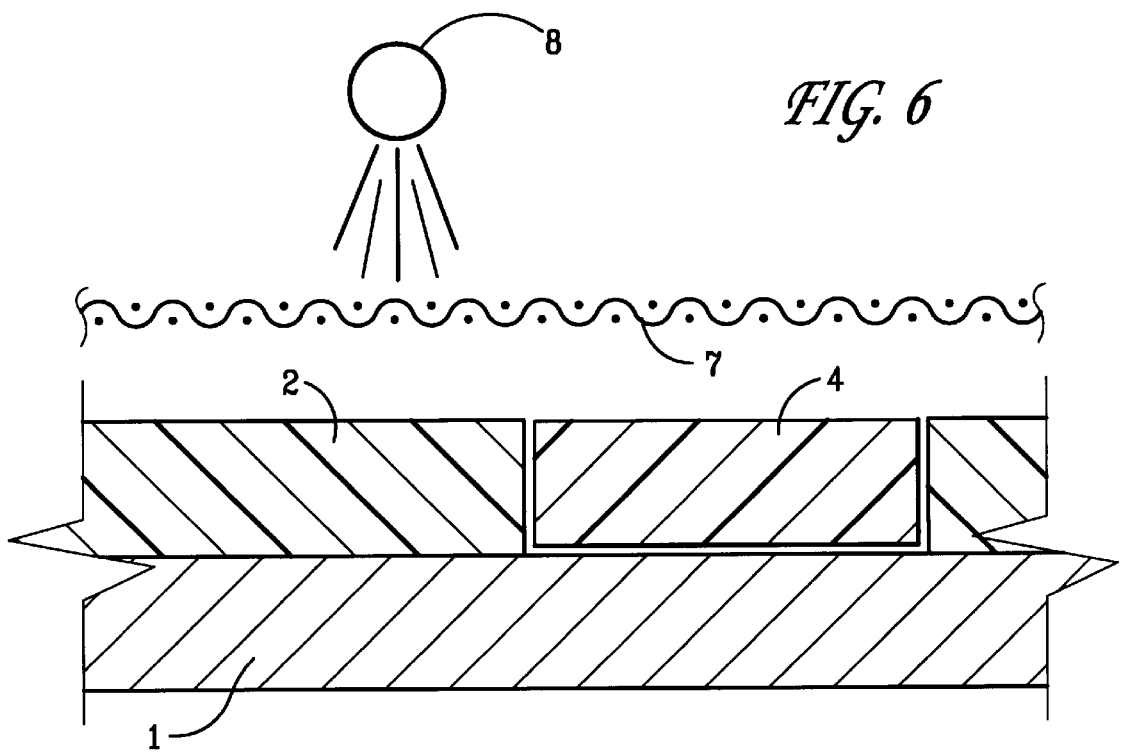
FIG. 6 illustrates the side view of FIG. 5 with a heat source 8 situated above the mesh.

According to a preferred practice of the instant invention, after the solder paste is deposited within the template 4 a mesh 7, as in the PPT® process mentioned above, is substituted for stencil 6 as in FIG. 5 and the method disclosed in the above-cited patents is followed. Sending the printed circuit board with the template in place on a conveyor, for example, past a heat source 8 adequate to reflow the solder suspended in the paste causes the solder to wick onto the copper contact and to retract from non-wettable template 4 leaving the solder deposited on the contact when using conventional technology. When using mesh, which is not wetted by the solder, the mesh contains the solder in the x, y and z configuration with the excess solder rising to the top through the mesh solidifying thereon and easily removed therefrom forming it with the mesh imprint on its surface without the need for flattening.

The mesh technique of the preferred embodiments has five major features:

1. uniform and rapid heating at a temperature only slightly above the melting of the solder;

2. gentle application pressure of the mesh on the substrate;

3. protection of the laminate, the permanent solder mask (where present) during forming of the solder;

4. the release agent character of air allowing easy separation of the mesh from the solid solder after cooling; and 5. the ability to maintain a proper form of the solder despite variations in the amount present.

In this preferred embodiment of this invention, a printed circuit board having both fine pitch copper contact solder deposits with a template in place on surface mount pads thereof, as well as coarse pitch copper contact solder deposited conventionally, said solder deposits are formed by a process comprising the steps of covering said board with a mesh material; placing said board with mesh thereon between surfaces capable of uniform compression; compressing; placing said compressed circuit board at any orientation in a heat transfer fluid medium (preferably air) maintained at an elevated temperature whereby the solder melts; removing said circuit board from the medium; cooling said circuit board to ambient temperature while compressed; and removing said circuit board from between the compressive surfaces and the mesh.

Rather than screen printing, paste printing employing a stencil provided at least equivalent performance without the need for as exact registration. With stencils, one can squeegee a relatively uniform thickness of paste over a large enough area to encompass a number of surface mount device (SMD) pads; these blocks of pads can be covered with solder as a unit. Such printed circuit boards and panels are usually only partially loaded with SMD pads. When the solder melts, the excess balls-up, and since it does not wet the solder mask, it rolls off the mesh leaving near-perfectly formed solid solder deposits with a high degree of co-planarity with the impression of the mesh imprinted on its top surface. Thus, not only are screen printing and registration problems eliminated, but rework is simplified by using the same technique, no special rework tool is required. It should be noted that the mesh ought to be in contact with the solder mask (or in the absence of solder mask, with the laminate and template) to inhibit the solder on the pads from wicking-up excess solder.

The use of mesh locks the volume element of solder into the mesh thereby controlling solder travel preventing sideways squeezing, squeezing upwards as well as downwards should there be insufficient solder in the well. The spreading of solder is prevented, the well is filled, low volume solder deposits are optimized and all this is done at an exposure to a rapid and uniform low temperature thereby preventing deterioration of the mask and board. The solder is then formed in a most desirable configuration.

There are those situations, for example with Tape Automated Bonding (TAB), where a Liquid Photo Imageable (LPI) resist solder mask is normally employed, where the LPI is unable to create a dam or web for the solder to isolate fine pitch features (less than 2 mil) on copper contacts. In another embodiment of this invention, a template will solve the problem by actually being a dam for the solder with no solder mask present.

The advantages of the use of mesh are that it:

1. is a conduit for bubbles, allowing the outgasses to be evacuated.

2. contains the solder deposit in the x, y, and z directions within the approximate periphery of the pads by moving the molten solder upwards and downwards within the mesh.

3. shapes the solder deposit without formation of "bumps" thereby eliminating the need for flattening.

4. fills the well with solder without squeeze-out.

5. increases pad size slightly thereby presenting an easier "target" for placement of a SMD by containing the molten solder within the approximate periphery of the pad.

6. allows a pad to hold more sticky flux prior to assembly than a perfectly planar one, improving adhesion of components since the grid pattern of the mesh is impressed on the uppermost portion of the formed solid solder; it is not flat.

7. allows variation of mesh characteristics. While a 60 mesh screen is acceptable for a ground plane, 230 mesh is better for a 20–50 mil pitch.

8. creates pad shapes which while irregular, nevertheless, give optimum performance.

9. is being used as a die or mold for the solder or paste and can capture even inordinately high volumes of solder.

10. performs its function whether the substrate is a printed circuit board laminate or a ceramic hybrid circuit board, or wherever else solder is applied, so long as the substrate can withstand the temperature, the slight pressure and the environment of the heat transfer fluid.

The mesh needs to have certain characteristics: it can be selected from the group consisting of stainless steels, glass cloths, chemically milled screens, chemically milled plates and laser-machined plates; and it includes counts of 60–300, and thicknesses, wire diameters and weaves consistent with this mesh count. When heating the mesh in contact with the circuit board in order to reflow solder, the heat can be provided by hot air, heated rollers, laser, hot bar and hot oil. It has been found that using hot air is a most effective technique. Heated rollers having hot air passing therethrough are also quite effective. When using a conveyerized method, reflow temperature should be maintained only sufficient to soften solder wherein the compressed circuit board is maintained at the elevated temperature for about 2–5 minutes. Compressing is done at a pressure only sufficient to form softened solder; the step of removing the circuit board from compressed contact with the mesh includes the step of releasing the mesh from the formed solder since all the elements used in contact with solder such as the stencil, the mesh, the template, etc., must be non-wetting by solder. The step of removing the mesh and cooling further includes the steps of: containing the thus-reflowed solder within the approximate periphery of the contacts, moving the thus-reflowed solder upwards and downwards within the mesh, and imprinting the mesh on the uppermost portion of the solder deposit. While the invention is not especially sensitive to whether deposited solder originates as solder paste, solid solder, solder cream or solder powder; or even whether the means for depositing solder are screen printing, paste stencilling, jet printing, automatically dispensing solder paste, electroplating or by immersion in a molten solder bath; the preferred method is solder paste screen printing.

There are those situations where a controlled high volume of solder is required on a specific site of a printed circuit board whether in the presence or absence of a solder mask. The template replaces the solder mask as a means for acting as an isolating barrier to contain molten solder and thereby shapes it to the particular configuration required by the components to be attached thereto.

Similarly, there are those situations where the method used in the formation of a solder deposit by means of a template vary. With a template in place, one method is conventional using a stencil, paste printing, removal of the stencil and reflowing the paste. Another is to use mesh after paste printing and stencil removal which eliminates flattening and provides a highly desirable deposit shape. Still another is to leave the stencil in place during reflow with removal after reflow. There are thus many different requirements dependent upon the nature of the component wherein a template greatly simplifies the deposition of solder and its shaping.

FIG. 7 is a process flow chart in block diagram form which is self-explanatory. As indicated, a solder mask may be necessary or not depending upon the application. So too with respect to the template, it may be left on a board permanently or removed which latter would be the normal case. The last four steps are included to illustrate the total process but are not subject matter of this invention.

The refinements introduced by the present invention will become particularly valuable as the industry progresses to finer pitch contact patterns, in that the invention provides a procedure for depositing controlled volumes of solder in fine pitch patterns without complex plating or exotic molten solder dispensing equipment. Furthermore, the process is fully compatible with conventional SMT equipment and methods of operation as presently used to populate printed circuit boards. Lastly, the process allows for the manufacture of printed circuit boards relatively independent of the manufacturing processes by which components are attached.

Since the present invention is constituted as explained above, the meritorious effects of the preferred embodiment of this invention as enumerated below are readily achieved by use of a template to form solder deposits on fine pitch copper contacts.

1. There is no need to flatten the top of the solder deposit.

2. There is no need to always use a solder mask; the solder mask dam/web is replaced with template.

3. There is no need to screen print twice.

4. Fine pitch registration problems are resolved.

5. On a printed circuit board or panel where multiple contact areas requiring different heights of solder are indicated, by using different template thicknesses one allows the formation of staggered solder deposits of varying heights and volumes.

6. Where a solder mask is required, mesh permits use of thin, inexpensive liquid-based solder masks as well as the more expensive dry film.

7. Multiple thermal excursions may increase intermetallic growth which latter can preclude solder wetting at assembly. The instant invention by requiring only a single thermal excursion not only reduces this problem but also can extend shelf-life.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming fine and coarse pitch solder deposits simultaneously on a circuit board comprising the steps of:

provising a solder mask having openings therein precisely aligned to coarse pitch contacts and defining only gross fine pitch contact areas of the circuit board;

registering a template having defined open fine pitch contact pattern areas therein with matching defined contact pattern areas on the circuit board;

positioning a stencil having openings aligned to fine and coarse pitch contacts over the entire circuit board in intimate contact with the uppermost surface thereof;

screen depositing solder paste into openings of the positioned stencil;

removing the stencil from the circuit board;

positioning mesh in intimate compressed contact with the entire circuit board;

reflowing the solder paste with the positioned mesh in place to form solder on the circuit board contacts to connect components thereto;

removing the mesh having excess solder on an upper surface thereof after the solder on the circuit board has been cooled and formed; and removing the template.

2. The method of claim 1 further comprising a plurality of templates on the circuit board.

3. The method of claim 2 wherein the plurality of templates are of differing heights for capturing varying volumes of solder.

4. The method of claim 1 further comprising a plurality of circuit boards on an individual panel.

5. The method of claim 1 wherein the fine pitch contacts are at a pitch nominally less than 16 mils while the coarse pitch contacts are at a pitch nominally 16 mils and greater.

6. The method of claim 1 wherein the method stops after the step of removing the mesh.

7. The method of claim 1 wherein the method begins with the step of registering a template.

8. The method of claim 1 wherein the stencil and template are formed from a material not wettable by solder selected from the group consisting of stainless steel, chrome plated steel, glass, molybdenum, adhesive films and plastic.

9. The method of claim 1 wherein the mesh material is selected from the group consisting of stainless steels, glass cloths, chemically milled screens, chemically milled plates and laser-machined plates.

10. The method of claim 1 wherein the mesh material includes counts of 60–300, and thicknesses, wire diameters and weaves consistent with this mesh count.

11. The method of claim 1 wherein deposited solder is selected from the group consisting of solder paste, solid solder, solder cream and solder powder.

12. The method of claim 1 wherein reflow temperature is maintained only sufficient to soften solder.

13. The method of claim 1 wherein the compressed circuit board is maintained at the elevated temperature for about 2–5 minutes.

14. The method of claim 1 wherein the step of removing the mesh and cooling further includes the steps of:

containing the thus-reflowed solder within the approximate periphery of the contacts;

moving the thus-reflowed solder upwards and downwards within the mesh; and imprinting the mesh on the uppermost portion of the solder deposit.

15. The method of claim 1 wherein top surfaces of solidified solder deposits are imprinted with the mesh configuration.

16. The method of claim 1 wherein the step of removing said circuit board from compressed contact with the mesh includes the step of releasing the mesh from the formed solder.

17. The method of claim 1, wherein said reflowing is selected from the group consisting of hot air, heated rollers, laser, hot bar and hot oil.

18. In the method of claim 17 wherein the heated rollers further comprise roller surfaces which are mesh and a source of hot air passing therethrough.

19. The method of claim 1 wherein means for depositing solder are selected from the group consisting of screen printing, paste stencilling, jet printing, automatically dispensing solder paste, electroplating and by immersion in a molten solder bath.

20. The method of claim 1 wherein compressing is done at a pressure sufficient to form softened solder.

21. The method of claim 1 wherein the circuit board is selected from the group consisting of a printed circuit board, a hybrid circuit board and a semiconductor wafer.

22. A method of forming fine and coarse pitch solder deposits simultaneously on a circuit board comprising the steps of:

providing a solder mask having openings therein precisely aligned to coarse pitch contacts and defining only gross fine pitch contact areas of the circuit board;

registering a template having defined open fine pitch contact pattern areas thereon with identically defined contact pattern areas on the circuit board;

positioning a stencil having openings aligned to fine and coarse pitch contacts over the entire circuit board in intimate contact with the uppermost surface thereof;

screen depositing solder paste into openings of the positioned stencil;

removing the stencil from the circuit board;

reflowing the solder paste to form solder on the circuit board contacts to connect components thereto; and removing the template.

23. The method of claim 22 wherein the template remains permanently on the circuit board.

* * * * *